(12) United States Patent
Murayama et al.

(10) Patent No.: US 7,259,514 B2
(45) Date of Patent: Aug. 21, 2007

(54) COLOR ORGANIC EL DISPLAY AND FABRICATION METHOD THEREOF

(75) Inventors: Koji Murayama, Shiga (JP); Atsushi Tanaka, Minamiashigara (JP)

(73) Assignees: Chi Mei Optoelectronics Corp., Tainan Science Based Industrial Park (TW); Kyocera Corporation, Kyoto (JP)

( * ) Notice: Subject to any disclaimer, the term of this patent is extended or adjusted under 35 U.S.C. 154(b) by 253 days.

(21) Appl. No.: 11/165,011

(22) Filed: Jun. 23, 2005

(65) Prior Publication Data

US 2005/0285508 A1 Dec. 29, 2005

(30) Foreign Application Priority Data

Jun. 25, 2004 (JP) .............................. 2004-187482

(51) Int. Cl.
*H01J 1/62* (2006.01)
(52) U.S. Cl. ....................... 313/506; 313/504
(58) Field of Classification Search ................ 313/498, 313/504, 506, 512
See application file for complete search history.

(56) References Cited

U.S. PATENT DOCUMENTS 6,541,130 B2 4/2003 Fukuda 6,737,800 B1 * 5/2004 Winters et al. ............. 313/504

FOREIGN PATENT DOCUMENTS

JP 2000-323277 5/1999

* cited by examiner

*Primary Examiner*—Vip Patel
(74) *Attorney, Agent, or Firm*—Milde & Hofberg, LLP

(57) ABSTRACT

An organic EL display and a fabrication method high in light extraction efficiency are disclosed, wherein a plurality of organic layers interposed between an emissive layer and a reflective layer can be collectively formed for a plurality of subpixels, thereby reducing the number of mask processes for a lower fabrication cost and higher productivity. The organic EL display comprises a plurality of organic EL cells classified into at least three types of blue light emission, green light emission and red light emission, each including a plurality of organic layers having an emissive layer, a reflective electrode deposited on the first main surface of the organic layers and a transparent electrode deposited on the second main surface of the organic layer. The organic EL cells for green light emission and red light emission have an optical transparent conductive film interposed between the reflective electrode and the organic layer.

9 Claims, 4 Drawing Sheets

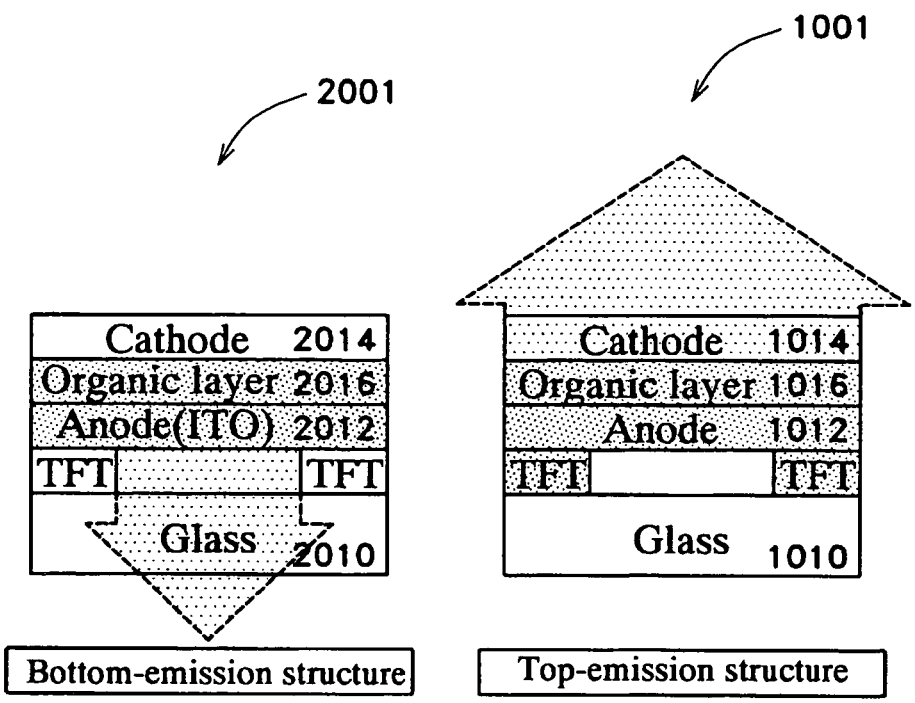
FIG. 4 (a)  Bottom-emission structure
FIG. 4 (b)  Top-emission structure
FIG. 5
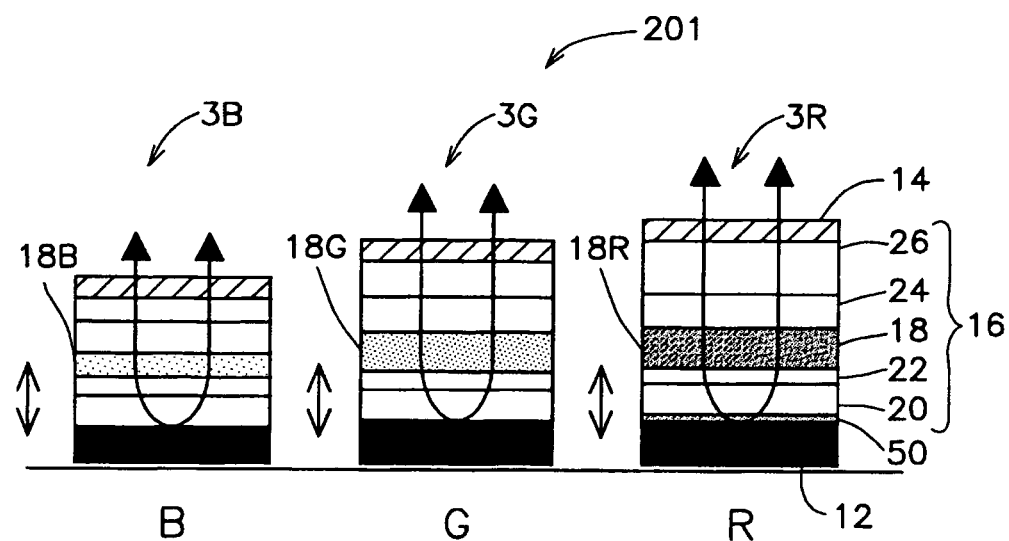

COLOR ORGANIC EL DISPLAY AND FABRICATION METHOD THEREOF

BACKGROUND OF THE INVENTION

1. Field of the Invention

This invention relates to a display using an organic electroluminescence (hereinafter referred to as the organic EL), in particular to an organic EL display for color display having an improved light extraction efficiency in a simple fabrication process and a method of fabricating the same.

2. Description of the Related Art

The organic EL display comprises self-emitting organic EL cells placed on a substrate of glass, etc., to emit light thereby to display information. The organic EL display is advantageously thin and light in weight, high in image quality, superior in dynamic image display, wide in the angle of view and low in power consumption as compared with the other types of thin displays. The organic EL display, therefore, is considered a promising candidate for the next-generation thin display supporting the ubiquitous society.

The organic EL display is configured of a plurality of organic layers held between an anode and a cathode. The organic layers, which may be made of a low-molecular material, often include a plurality of function layers such as a hole transporting layer and/or a hole injection layer or an electron transporting layer and/or an electron injection layer on both sides of an emissive layer.

Upon application of a DC voltage between the anode and the cathode sandwiching the organic layers of the organic EL cell, holes and electrons are sent into the emissive layer through the layers described above. The holes and the electrons are recombined with each other in the emissive layer and generate energy, which excites the electrons of the organic molecules contained in the emissive layer. While this very unstable electronic state falls to the ground state, energy is generated as light so that the organic EL cell emits light. This luminescence principle is shared with the light emitting mechanism of the light-emitting diode (LED), and therefore the organic EL cell is also called the organic light emitting diode (OLED).

The method of driving the organic EL cell is roughly divided into the passive matrix method and the active matrix method. In the passive matrix method, band-shaped anodes and cathodes are laid horizontally and longitudinally in array, and the organic EL cell held at each intersection is selectively driven to emit light. In the active matrix method, on the other hand, each pixel is composed of a thin-film transistor (TFT) having the dual function of a switch and a memory whereby the organic EL cell emits light. The active matrix method in which light is positively emitted from the pixels using TFT, though higher in fabrication cost than the passive matrix method, is low in power consumption and high in brightness.

The method of extracting light from the conventional organic EL display, on the other hand, is divided into the bottom emission method and the top emission method. In the bottom emission method, as shown in FIG. 4($a$), light is extracted from the insulating substrate 2010 side. In the top emission method, on the other hand, as shown in FIG. 4($b$), light is extracted from the upper surface side of the cathode 1014. In the organic EL display 1001 of active matrix type, the TFT is formed on the substrate, and therefore the top emission method can more advantageously improve the light extraction efficiency by increasing the aperture ratio.

The full-color display mechanism of the organic EL display is basically identical with that of the liquid crystal display. Specifically, subpixels of the three primary colors, i.e. red, green and blue (which may hereinafter be referred to as RGB) are arranged on the substrate and various colors are produced by color mixture in accordance with the outputs of the three primary colors. In the color organic EL display, therefore, three types of organic EL cells for emitting blue, green and red light are arranged sequentially as subpixels on the substrate.

To increase the brightness of the organic EL display, the light emitted from each organic EL cell is required to be extracted as much as possible. The organic EL display is a device emitting light in a very thin organic film of about 1500 Å, and the light expands in every direction at solid angle of $\Omega=4\pi$ in the film. In the organic EL display 1001 of top emission type, as schematically shown in FIG. 3($a$), light is normally emitted through the cathode 1014, while at the same time the light emitted to the anode 1012 is reflected on the anode 1012 and also emitted from the cathode 1014 side. In the organic. EL display of bottom emission type, on the other hand, the functions of the anode and the cathode are simply reversed. The organic EL display 1001 of top emission type, therefore, generally employs the anode 1012 as a reflective electrode high in reflectivity and the cathode 1014 as a transparent electrode high in transmittance.

Further, in order to improve the light extraction efficiency of the organic EL display, the light leaving the transparent electrode directly and the light leaving from the transparent electrode after being reflected on the reflective electrode are required to reinforce each other. Let L be the optical reflection distance between the light emitting portion having the highest light emission intensity in the emissive layer and the reflective electrode, and $\phi$ be the phase change of light reflected on the reflective electrode. The conditions for extracting the light having the wavelength $\lambda$ at high efficiency utilizing the reinforcing effect of interference is given as $L+\lambda\phi/4\pi=(2m+1)\lambda/4$, $m=0, 1, 2 \ldots$ where $d_i$ is the thickness and $n_i$ the refractive index of the ith function layer. Then, $L=\Sigma_{(i)}n_i d_i$. Unless the thickness of the function layers included in the organic layers for each cell is set in an appropriate range as shown in FIG. 3($a$), therefore, a sufficient brightness cannot be secured. Especially, as long as the function layers for R and B having a large difference in wavelength are prepared with the same thickness, it is difficult to obtain characteristics satisfactory for both colors without sacrificing one of the colors. Since R is larger in wavelength than B, for example, the function layers for R are preferably thicker than those for B to increase the optical reflection distance L.

Thus, the color organic EL display having low-molecular organic layers is fabricated in the following manner, for example, taking advantage of what is called the mask process. In the following description, FIG. 3($a$) or FIG. 7 is referred to and the metal mask is used.

(1) An insulated substrate 1010 is prepared, and patterned with a reflective electrode 1012 by sputtering using the metal mask. The reflective electrode 1012 is formed of an Al mixture or Cr, etc. and makes up an anode, for example.

(2) Next, the metal mask is set in position on the reflective electrode 1012 of the red subpixel to deposit organic layers on the reflective electrode 1012. Normally, the metal mask opens only above the red subpixel, for example, and can be deposited by evaporation with only the subpixel of the particular color. In FIG. 3($a$), a hole injection layer 1020, a hole transporting layer 1022 and a red emitting layer 1018 of a predetermined thickness corresponding to red light are stacked by vacuum deposition, for example, through the metal mask. Then, the metal mask is fixed, and an electron transporting layer 1024 and an electron injection layer 1026 of a predetermined thickness corresponding to the wavelength of red light are stacked on the red emitting layer 1018 by vacuum deposition.

(3) Next, the metal mask is slightly moved, and set in position in such a manner that the organic layers can be deposited by evaporation on the reflective electrode 1012 making up the green emitting layer, for example. The function layers including the hole injection layer 1020, the hole transporting layer 1022, the emissive layer 1018, the electron transporting layer 1024 and the electron injection layer 1026 of a predetermined thickness corresponding to the green light wavelength are stacked in this order by vacuum deposition.

(4) Next, the metal mask is set in position so that the organic layers can be deposited by evaporation on the reflective electrode 1012 forming a blue emitting layer. Subsequently, like in the process described above, the function layers of a predetermined thickness corresponding to the blue light wavelength, with the blue emitting layer 1018 held therebetween, are vapor-deposited sequentially through the blue emitting layer 1018.

(5) Finally, the metal mask corresponding to each subpixel is removed, and the transparent electrode 126 of ITO (indium tin oxide), etc. is deposited over the entire surface. In this case, the transparent electrode functions as a cathode.

The use of the complicated mask process described above makes it possible to fabricate the organic EL display in which the emitted light can be extracted with high efficiency using the mutual reinforcing effect of interference. As long as a low-molecular material is used as a light emitting material and formed separately for each color with a metal mask, however, all the organic layers are required to be formed separately from each other using the masks for each color. Especially in the case where the organic EL display of top emission structure is fabricated advantageously to increase the light emitting area, all the organic layers are required to be separately formed from each using a mask for each color to achieve both a high color purity and a high emission efficiency at the same time in view of the fact that the range of an appropriate thickness of each organic layer is varied depending on the light extraction efficiency for each of the colors of R, G and B. As a result, the time required for the vapor deposition of the mask is increased, which not only reduces the productivity but also increases the fabrication cost.

In the case where all the organic layers are formed separately using the metal mask, various problems are posed by the forming time, the material utilization factor, the mask cleaning frequency, etc.

In the top emission structure, however, the anode is often used as a reflective electrode, and the hole injection layer and the hole transporting layer can be formed of the same material for RGB between the anode and the emissive layer. In the fabrication process, therefore, these layers are formed far more advantageously collectively without using the mask.

Japanese Unexamined Patent Publication No. 2000-323277 discloses a multicolor organic EL display in which predetermined function layers included in the organic layers formed between the emissive layer and the reflective electrode are collectively formed in the same process.

In the organic EL display described in Japanese Patent Publication No. 2000-323277, however, the function layers included in the organic layers interposed between the emissive layer and the transparent electrode are formed in the same process, while the remaining organic layers (supplementary layers) interposed between the emissive layer and the transparent electrode have different thickness for different subpixels. In Patent Publication No. 2000-323277, therefore, the organic layers are simply set to an appropriate value for each subpixel and the mask process according to the prior art is not effectively reduced.

Accordingly, it is an object of this invention to provide an organic EL display and a fabrication method thereof high in light extraction efficiency, in which the organic layers interposed between the emissive layer and the reflective electrode can be formed collectively for a plurality of subpixels, and the fabrication cost is reduced with an improved productivity by reducing the number of mask processes.

SUMMARY OF THE INVENTION

According to one aspect of this invention, there is provided an organic EL display comprising a plurality of organic EL cells each including a plurality of organic layers having an emissive layer, a reflective electrode deposited on the first main surface of the organic layers, a transparent layer deposited on the second main surface of the organic layers, the organic EL cells being classified into at least three types of blue emission, green emission and red emission, wherein the green-emitting organic EL cell and the red-emitting organic EL cell have an optical transparent conductive film interposed between the reflective electrode and the organic layers.

According to another aspect of the invention, there is provided an organic EL display, wherein the optical transparent conductive film of the green- and red-emitting organic EL cells is thicker than that of the blue-emitting organic EL cell. As an alternative, the green- and red-emitting organic EL cells have a larger distance between the emissive layer and the reflective electrode than the blue-emitting organic EL cell. As another alternative, in the organic EL display according to the invention, the green- and the red-emitting organic EL cells have substantially the same thickness of the optical transparent conductive film.

According to still another aspect of the invention, there is provided an organic EL display comprising a plurality of organic EL cells each including an emissive layer, a plurality of organic layers having a first main surface and a second main surface, a reflective electrode deposited on the first main surface of the organic layers and a transparent electrode deposited on the second main surface of the organic layers, wherein the organic EL cells are classified into at least two types by the color of the light emitted by the emissive layer of the respective organic EL cells, wherein at least one of a plurality of types of the organic EL cells has an optical transparent conductive film between the reflective electrode and the organic layers, and wherein the distance from the first main surface of the organic layers to the emissive layer is substantially same for all the organic EL cells.

According to yet another aspect of the invention, there is provided a method of fabricating an organic EL display comprising a plurality of organic EL cells each including an emissive layer and at least one function layer and classified into at least three types of blue emission green emission and red emission by the color of the light emitted from the particular emissive layer, the method comprising the steps of preparing a substrate, forming a plurality of reflective electrodes on the substrate, forming an optical transparent conductive film on each reflective electrode of the red- and/or green-emitting organic EL cell, forming at least one function layer uniformly over the entire surface of the substrate, and forming at least blue-, green- and red-emissive layers on the one function layer corresponding to the organic EL cell for blue light emission, green light emission, and red light emission respectively.

According to this invention, an organic EL display has been successfully developed, in which with regard to the subpixels (R and/or G, for example) requiring a distance between the emissive layer and the reflective electrode, an optical transparent conductive film of a predetermined thickness is formed between the organic layers and the reflective electrode, so that even in the case where the organic layers (function layers) interposed between the emissive layer and the reflective electrode are formed to substantially the same thickness, each subpixel has both a satisfactory brightness and a satisfactory purity. The fabrication cost and the Tact time (cycle time) of this organic EL display are very small as compared with those of the organic EL display in which all the organic layers are formed separately from each other by metal masks.

BRIEF DESCRIPTION OF THE DRAWINGS

FIG. 4(a) is a sectional view showing a method of emitting the light of an active organic EL display of bottom emission type.

FIG. 4(b) is a sectional view showing a method of emitting the light of an active organic EL display of top emission type.

FIG. 5 is a sectional view showing a light emission path of the organic EL display according to a second embodiment of the invention.

DESCRIPTION OF THE PREFERRED EMBODIMENTS

Figure 1:
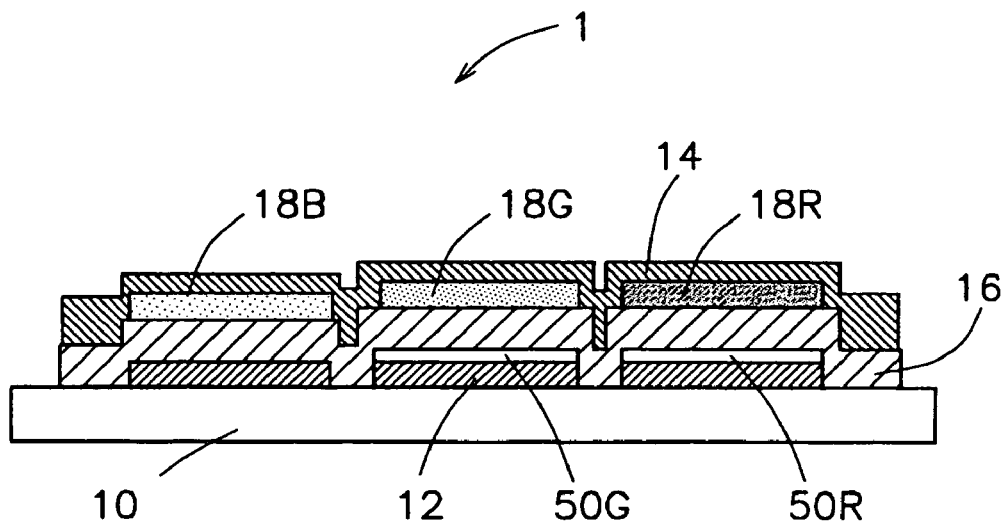
FIG. 1 is a sectional view of an organic EL display according to a first embodiment of the invention.

FIG. 1 is a sectional view showing an organic EL display according to a first embodiment of the invention. In FIG. 1, the organic EL display 1 according to the invention comprises: a plurality of organic layers 16 including an emissive layer 18 which have a first main surface and a second main surface; a plurality of reflective electrodes 12 deposited on the first main surface of the organic layers 16; and a transparent electrode 14 deposited on the second main surface of the organic layers 16. The reflective electrode 12 is an anode formed of an Al mixture, Cr, etc. The transparent electrode 14 functions as a cathode formed of ITO (indium tin oxide), a MgAg thin film with ITO or IZO (indium zinc oxide), or LiF with an Al thin film.

Figure 3:
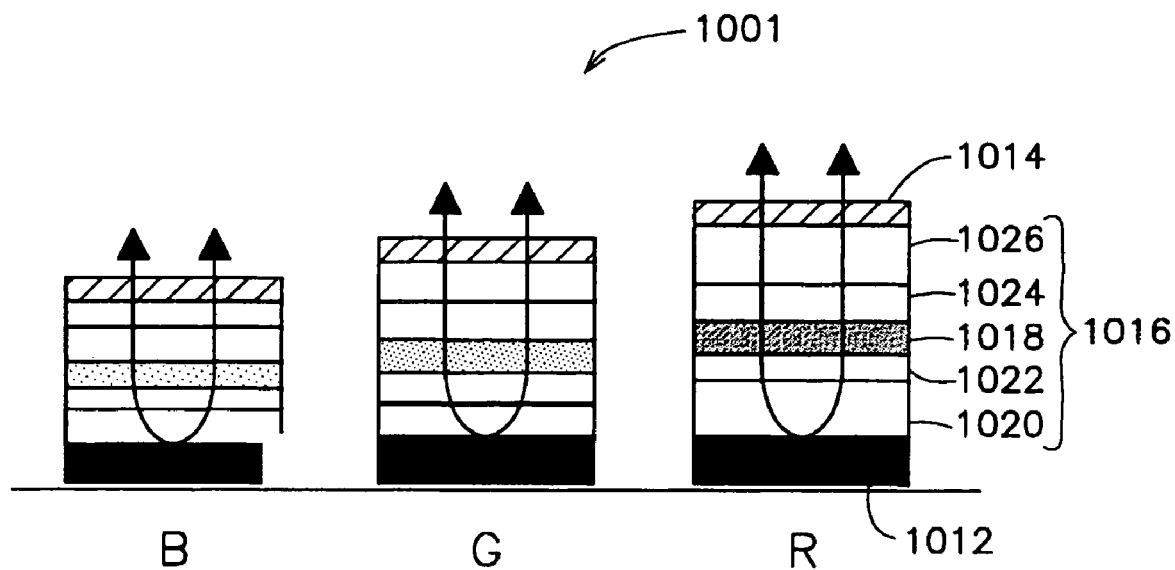
FIG. 3(a) is a sectional view showing a light emission path of the conventional organic EL display.
FIG. 3(b) is a sectional view showing a light emission path of the organic EL display according to the first embodiment of the invention.
Figure 3:
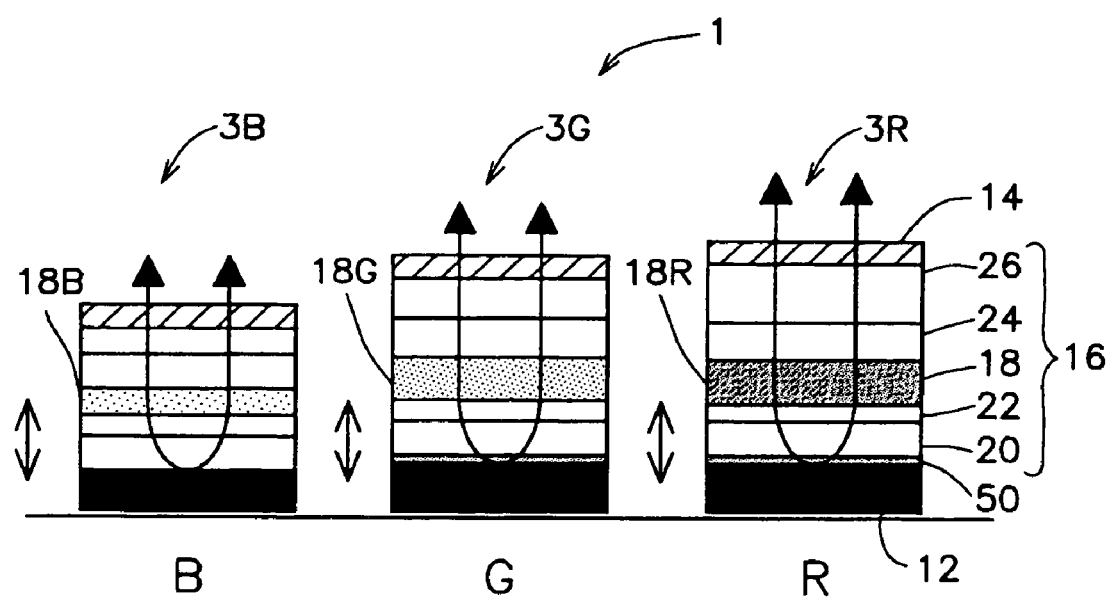

As schematically shown in FIG. 3(b), the organic layers 16 have an emissive layer 18, which in turn is classified into at least three types of blue-, green- and red-emissive layers 18B, 18G, 18R. The organic layers 16 further include a plurality of function layers sandwiching the emissive layer 18. The function layers include a hole transporting layer 22 and a hole injection layer 20 on the reflective electrode 12 side of the emissive layer 18, and an electron transporting layer 24 and an electron injection layer 26 on the transparent electrode 14 side of the emissive layer 18. In FIG. 1, the organic layers 16 include the emissive layers 18B, 18G, 18R, while the electron transporting layer 24 and the electron injection layer 26 are not shown.

The organic EL display 1 according to the invention includes a plurality of organic EL cells 3B, 3G, 3R of at least three types of blue emission, green emission and red emission. The green-emitting organic EL cell 3G and the red-emitting organic EL cell 3R have an optical transparent conductive film 50 between the reflective electrode 12 and the organic layers 16.

The organic EL display 1 according to this embodiment shown in FIGS. 1 and 3(b) is of top emission type, and the organic layers 16 are formed of a low-molecular organic material, dendrimer or a high polymer. In FIG. 3(b), the optical transparent conductive film 50 between the reflective electrode 12 and the organic layers 16 of the organic EL cell 3G and the organic EL cell 3R is formed of ITO, IZO, etc. and have substantially the same thickness of 10 nm to 200 nm.

In the organic EL display 1 according to this embodiment shown in FIG. 3(b), the organic layers 16 include a hole injection layer 20, a hole transporting layer 22, an emissive layer 18, an electron transporting layer 24 and an electron injection layer 26 stacked in this order on the reflective electrode 12 or the optical transparent conductive film 50. Specifically, the organic EL cell 3B is formed of the organic layers 16 on the reflective electrode 12, while the organic EL cells 3G, 3R are formed of the organic layers 16 on the optical transparent conductive film 50. In the organic EL display 1 according to this invention, the hole transporting layer 22 and the hole injection layer 20 sandwiched between the emissive layer 18 and the reflective electrode 12 or the optical transparent conductive film 50 have substantially the same thickness for the organic EL cells 3B, 3G, 3R.

Further, in the organic EL display 1 according to this embodiment, the electron transporting layer 24 and the electron injection layer 26 formed on the emissive layer 18 may have different thickness among the organic EL cells 3B, 3G, 3R. The thickness of the electron transporting layer 24 and the electron injection layer 26 changes with the light emission wavelength of the organic EL cells 3B, 3G, 3R, the thickness or refractive index of each layer forming the organic EL cells 3 and the thickness of the optical transparent conductive film 50. These factors, therefore, are taken into consideration to optimize the thickness of the electron transporting layer 24 and the electron injection layer 26.

The thickness of the function layers included in the color organic layers of the organic EL display 1 according to this embodiment having the aforementioned structure is described in detail.

As described above, let L be the optical reflection distance between the light emitting portion having the highest light emission intensity in the emissive layer and the reflective electrode. The condition for emitting the light having the wavelength λ with a high efficiency taking advantage of the mutual reinforcing effect by interference of light is expressed by Expression (1). According to this embodiment, the organic EL cell 3B is formed of the hole transporting layer 22 and the hole injection layer 20 between the emissive layer 18 and the reflective electrode 12, while the organic EL cells 3G, 3R further include the optical transparent conductive film 50. The hole transporting layer 22 and the hole injection layer 20, however, have substantially the same thickness for all the organic EL cells 3, as described above.

Assume that the optical reflection distance between the light emitting portion and the reflective electrode of the respective organic EL cells 3 are $L_B$, $L_G$, $L_R$, the wavelength of the light emitted from the color emissive layers 18B, 18G, 18R are $\lambda_B$, $\lambda_G$, $\lambda_R$, and the phase change of the light reflected on the reflective electrode 12 are $\phi_B$, $\phi_G$, $\phi_R$, respectively.

Also, assume that the thickness of the hole transporting layer 22, the hole injection layer 20 and the optical transparent conductive film 50 are $d_{HTL}$, $d_{HIL}$, $d_{ITO}$, and the refractive index $n_{HTL}$, $n_{HIL}$, $n_{ITO}$, respectively. The following relation holds.

$$L_B = n_{HTL\cdot B}\, d_{HTL} + n_{HIL\cdot B}\, d_{HIL} - \lambda_B \varphi_B / 4\pi \quad (2)$$
$$= (2m_B + 1)\lambda_B / 4,\ m_B = 0, 1, 2\cdots$$
$$L_R = n_{ITO\cdot R}\, d_{ITO} + n_{HTL\cdot R}\, d_{HTL} + n_{HIL\cdot R}\, d_{HIL} - \lambda_R \varphi_R / 4\pi$$
$$= (2m_R + 1)\lambda_R / 4$$
$$m_R = 0, 1, 2\cdots$$

or $$L_G = n_{ITO\cdot G}\, d_{ITO} + n_{HTL\cdot G}\, d_{HTL} + n_{HIL\cdot G} d_{HIL} - \lambda_G \varphi_G / 4\pi \quad (3)$$
$$= (2m_G + 1)\lambda_G / 4$$
$$m_G = 0, 1, 2\cdots$$

According to this embodiment, the refractive index and the thickness of the hole transporting layer 22 and the hole injection layer 20 are set in an appropriate range based on Expression (2) in such a manner that the light emission intensity approaches a peak in the blue organic EL cell 3B, for example. The refractive index and thickness of the hole transporting layer 22 and the hole injection layer 20 are determined by securing optimizing the blue organic EL cell 3B based on Expression (2), as described above. For the light emission intensity to approach a peak in the red organic EL cell 3R or the green organic EL cell 3G, therefore, the refractive index and the thickness of the optical transparent conductive film 50 are required to be set in an appropriate range based on Expression (3). Due to the wavelength difference between R and G, it is difficult to satisfy the first and second equations of Expression (3) at the same time. Therefore, one of R and G is optimized at the sacrifice of the other color. The organic EL cell emitting green light, however, generally has a higher emission efficiency and a higher visual sensitivity than the organic EL cells emitting blue and red. In the green organic EL cell, therefore, a slight change in refractive index or thickness from the optimum value has little effect on the performance. Therefore, the red organic EL cell is more suitably optimized. Also, as compared with the B wavelength, the G wavelength is near to the R wavelength, and therefore optimization of R has a smaller effect on G. In this case, the refractive index and thickness of the optical transparent conductive film 50 are preferably optimized based on Expression (3) with reference to R. As described in the first specific example later, the organic EL display 1 according to this embodiment successfully produces a satisfactory color purity and brightness for all the colors of RGB.

In the organic EL display 1 according to this embodiment with the organic layers 16 and the optical transparent conductive film 50 adjusted to satisfy Expressions (2) and (3), an appropriate voltage higher than the light emission threshold voltage is applied between the reflective electrode 12 as an anode and the transparent electrode 14 as a cathode. Then, as described above, the emissive layers 18R, 18G, 18R emit fluorescent or phosphorescent light of RGB, respectively. Each color light radiated substantially perpendicularly to the substrate propagates toward the transparent electrode 14 and the reflective electrode 12, so that the light proceeding straight toward the transparent electrode 14 is led out of the transparent electrode 14. The light that has proceeded toward the reflective electrode 12, on the other hand, is reflected on the reflective electrode 12 and propagates toward the transparent electrode 14. The light reflected on the reflective electrode 12 interferes with the light radiated toward the transparent electrode 14 from the emissive layer 18. In view of the fact that the organic EL cells 3B, 3G, 3R are adjusted to satisfy Expressions (2) and (3), however, the straight light and the reflected light reinforce each other and are led out of the transparent electrode 14.

Now, with reference to FIGS. 1 and 3(b), the process of fabricating the organic EL display 1 according to this embodiment is described. The organic EL display 1 is a color organic EL display of top emission type having a low-molecular organic layer, and fabricated in the manner described below using the mask process as mentioned above.

(1) An insulated substrate is prepared, and a reflective electrode 12 is patterned on the insulating substrate by sputtering using a metal mask. The reflective electrode 12 is formed of an Al mixture or Cr and functions as an anode.

(2) An optical transparent conductive film 50 having a uniform thickness as determined by Expression (3) is patterned by etching through a well-known photolithography process only on the reflective electrode 12 constituting subpixels of R and G. The optical transparent conductive film 50 is formed of ITO, IZO, etc. and has a thickness as small as 20 nm.

(3) A hole injection layer 20 and a hole transporting layer 22 for RGB having the thickness determined by Expressions (2) and (3) are stacked over the entire surface of the substrate, for example, by vacuum deposition. Unlike in the conventional fabrication method, the complicated mask process such as the mask positioning is not required, but the layers are collectively formed for RGB, and therefore the hole injection layer 20 and the hole transporting layer 22 have substantially the same thickness for RGB.

(4) Next, the metal mask is set in position to make possible the vapor deposition of, for example, the R emissive layer 18R of RGB. The emissive layer 18R is stacked through the metal mask on the hole transporting layer 22 by vapor deposition. Immediately after that, with the metal mask fixed, the electron transporting layer 24 and the electron injection layer 26 are stacked on the emissive layer 18R.

(5) Then, the metal mask is set in position in such a manner that the organic layers can be formed by vapor deposition, for example, on the hole transporting layer 22 on which the emissive layer 18G for green color is formed. For green light, the emissive layer 18G, the electron transporting layer 24 and the electron injection layer 26 are stacked in this order by vapor deposition.

(6) Further, to form the organic layers by vapor deposition on the blue subpixel, the metal mask is set in position. Then, like in the process described above, the emissive layer 18B, the electron transporting layer 24 and the electron injection layer 26 for blue light are formed in this order by vapor deposition.

(7) Finally, the metal mask corresponding to each subpixel is removed, and the transparent electrode 14 composed of ITO (indium tin oxide) or a MgAg thin film with ITO is stacked over the entire surface.

In the fabrication process according to this invention, as compared with the conventional fabrication process, step (2) is added, while step (3) is different from the conventional fabrication method in that the complicated mask process including the mask positioning is considerably reduced. Especially in step (3) according to this embodiment, the hole injection layer 20 and the hole transporting layer 22 are formed over the entire surface of the substrate, and therefore the mask process is eliminated. Specifically, according to this embodiment, the optical transparent conductive film 50 of a predetermined thickness is formed on the reflective electrode 12 only for the R and G subpixels, and the hole injection layer 20 and the hole transporting layer 22 for all the subpixels of RGB are collectively formed in the same process to substantially the same thickness without any requirement of the mask.

The use of the method of fabricating the organic EL display according to the invention, therefore, is very advantageous in respect of both the fabrication cost and the Tact time (cycle time). The adverse effect on the fabrication cost and the Tact time in step (2) above is very small as compared with the case in which all the organic films are coated differently by a metal mask.

Also, the interposition of the optical transparent conductive film 50 for RG makes it possible to design the distance between the reflective electrode 12 and the emissive layer 18 in an appropriate range for each of RGB even in the case where the hole transporting layer 22 and the hole injection layer 20 are formed in substantially the same thickness for all of RGB, thereby achieving the desired color purity and the desired light emission efficiency.

Next, another embodiment is explained. In the accompanying drawings, the same component parts as those of the first embodiment are designated by the same reference numerals, respectively.

According to the first embodiment described above, the optical transparent conductive film 50 of a predetermined thickness is formed on the reflective electrode 12 only for the R and G subpixels. In the organic EL display 201 according to the second embodiment shown in FIG. 5, the optical transparent conductive film 50 of a predetermined thickness is formed on the reflective electrode 12 only for the R subpixel, and the hole injection layer 20 and the hole transporting layer 22 are formed in the same thickness collectively for all the RGB subpixels. The organic EL display 201 according to the second embodiment shown in FIG. 5, therefore, is different from the first embodiment only in that the optical transparent conductive film 50 on the reflective electrode 12 of the G subpixel is eliminated from the organic EL display 1.

Thus, the component parts and the fabrication method are not further described, and the conditions to be satisfied by the thickness of the function layers to emit the light of each wavelength $\lambda_B$, $\lambda_R$ with high efficiency utilizing the reinforcement by interference are described.

$$L_B = n_{HTL,B} \, d_{HTL} + n_{HIL,B} \, d_{HIL} - \lambda_B \varphi_B / 4\pi \quad (4)$$
$$= (2m_B + 1) \lambda_B / 4,$$
$$m_B = 0, 1, 2 \cdots$$

$$L_R = n_{ITO\text{-}R} \, d_{ITO} + n_{HTL,R} \, d_{HTL} + n_{HIL,R} d_{HIL} - \lambda_R \varphi_R / 4\pi \quad (5)$$
$$= (2m_R + 1) \lambda_R / 4$$
$$m_R = 0, 1, 2 \cdots$$

According to the second embodiment, the optical transparent conductive film 50 of a predetermined thickness is formed on the reflective electrode 12 only for the R subpixel, and the hole injection layer 20 and the hole transporting layer 22 of the same thickness can be collectively stacked on the subpixels of all RGB.

Figure 6:
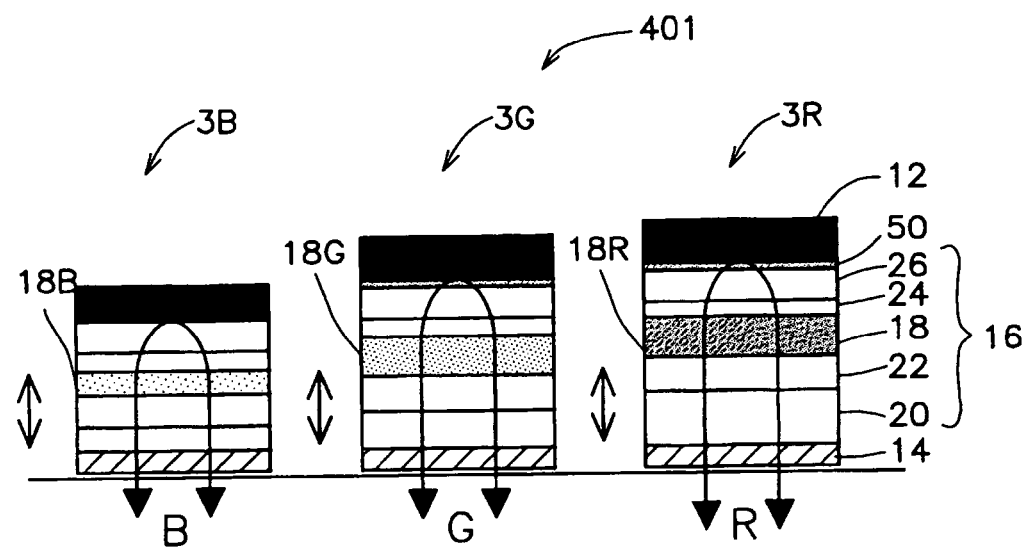
FIG. 6 is a sectional view showing a light emission path of the organic EL display according to a third embodiment of the invention.
Figure 7:
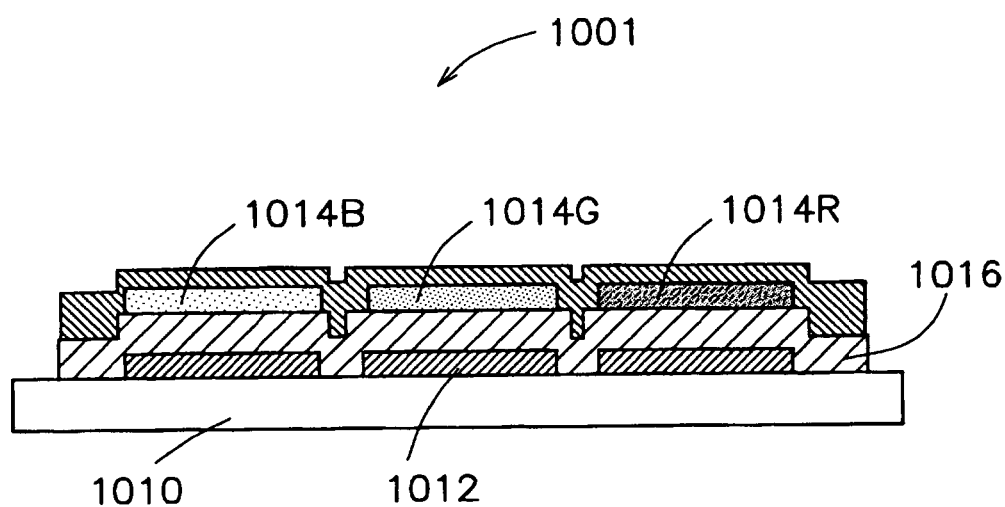
FIG. 7 is a sectional view of the conventional organic EL display.

The first and second embodiments are described above with reference to the display of top emission type to emit light from the cathode-side upper surface. The organic EL display according to the invention, however, may be of bottom emission type. The display of bottom emission type according to a third embodiment is explained below with reference to FIG. 6.

The organic EL display 401 according to the third embodiment of the invention shares the stack pattern of the organic layers 16 of the organic EL display 1 according to the first embodiment, and has a structure in which the reflective electrode 12 and the transparent electrode 14 with the organic layers 16 held therebetween are replaced with each other. The substrate is transparent, and the transparent electrode 14 as an anode, the organic layers 16, the optical transparent conductive film 50 and the reflective electrode 12 as a cathode are stacked in this order on the transparent substrate.

The emissive layer 18 and the function layers included in the organic layers 16 may be the same as those of the organic EL display 1 according to the first embodiment, and the material of the reflective electrode 12 and the transparent electrode 14 may be the same as those of the organic EL display 1.

In the first and second embodiments described above, the thickness of the hole transporting layer 22 and the hole injection layer 20 is optimized from Expressions (2) and (3). According to the third embodiment, on the other hand, the electron transporting layer 24 and the electron injection layer 26 are interposed as function layers between the reflective electrode 12 and the emissive layer 18, and therefore, the electron transporting layer 24 and the electron injection layer 26, together with the optical transparent conductive layer 50, are optimized based on Expressions (2) and (3). In Expressions (2) and (3), the hole transporting layer and the hole injection layer are replaced with the electron transporting layer and the electron injection layer, respectively, and the conditions to be satisfied by the thickness of the electron transporting layer, the electron injection layer and the optical transparent conductive film are calculated in the same way as in the first embodiment (by an equation not shown).

The organic EL display 401 according to the third embodiment is fabricated through the process described below.

(1) A transparent substrate such as a glass substrate is prepared, and a transparent electrode 14 (ITO, IZO, etc.) making up an anode is patterned by sputtering using a metal mask on the transparent substrate by photolithography or etching.

(2) A hole injection layer 20 thinnest of all the colors, or for example, having the thickness required for the B subpixel is formed by vapor deposition over the whole surface of the transparent substrate.

(3) Next, the metal mask is set in position, and the shortage of the hole injection layer 20 is formed by vapor deposition to a predetermined thickness on the G subpixel.

(4) Further, the metal mask is set in position for the R subpixel, and the shortage of the hole injection layer 20 is formed by vapor deposition to a predetermined thickness on the R subpixel.

(5) The mask process of (2) to (4) is repeated for vapor deposition of the hole transporting layer 22, and the predetermined hole transporting layer 22 is stacked on the hole injection layer 20 for the RGB subpixels.

(6) The emissive layer 18 is formed by vapor deposition on the hole transporting layer 22.

(7) The electron transporting layer 24 and the electron injection layer 26 of a thickness predetermined from Expressions (2) and (3) are stacked in this order for RGB at the same time over the entire surface of the emissive layer 18.

(8) The metal mask is set in position, and the optical transparent conductive film 50 of the same thickness determined by Expression (3) is patterned by sputtering or vapor deposition only on the electron injection layer 26 constituting the R and G subpixels.

(9) Finally, the metal mask corresponding to each subpixel is removed and the reflective electrode 12 is stacked over the entire surface.

Also in the aforementioned process of fabricating the organic EL display 401, the electron transporting layer 24 and the electron injection layer 26 are formed in the same thickness collectively for all the RGB subpixels without using any mask.

Further, since the optical transparent conductive film 50 is interposed for RG, the distance between the reflective electrode 12 and the emissive layer 18 can be designed in an appropriate range for each of RGB even in the case where the electron transporting layer 24 and the electron injection layer 26 are formed in substantially the same thickness for RGB. Thus, the desired color purity and the desired emission efficiency can be achieved.

In the organic EL display 401 according to the third embodiment, the R and G subpixels corresponding to the organic EL display 1 in the first embodiment include the optical transparent conductive film 50 of the same thickness. Nevertheless, the same optical transparent conductive film 50 as in the second embodiment may be included.

Specifically, the organic EL display according to a fourth embodiment of the invention, like the organic EL display 201 in the second embodiment, is of bottom emission type having an optical transparent conductive film 50 only for the R subpixel.

Also in the fabrication process of the organic EL display according to the fourth embodiments described above, the electron transporting layer 24 and the electron injection layer 26 can be formed for the subpixels of all RGB without any mask process. Also, the distance between the reflective electrode 12 and the emissive layer 18 can be designed in an appropriate range for each of RGB according to Expressions (2) and (3), thereby achieving the desired color purity and the desired emission efficiency.

The organic EL display according to the embodiments of the invention is explained above. Nevertheless, the organic EL display according to the invention is not limited to the embodiments described above and an example described below. Specifically, the optical transparent conductive film 50 may be formed between the organic layers 16 and the reflective electrode 12 for all the subpixels of RGB. In this case, the thickness of the optical transparent conductive film 50 for each subpixel can be set in an appropriate range using Expression (3) above and Expression (6) below. Also, the optical transparent conductive film 50 for R and G may be set to a substantially equal thickness and the optical transparent conductive film 50 for B to a thickness smaller than for R and G in an appropriate range independent of R and G. In this case, the optical transparent conductive film 50 can be formed collectively for R and G in the same process for an improved productivity of the organic EL display.

$$L_B = n_{ITO}\, d_{ITO(B)} + n_{HTL\,B}\, d_{HTL} + n_{HIL\,B} d_{HIL} - \lambda_B \varphi_B / 4\pi \qquad (6)$$
$$= (2m_B + 1)\lambda_B / 4,$$
$$m_B = 0, 1, 2 \cdots$$

The optical transparent conductive film 50 is not necessarily formed between the reflective electrode 12 and the function layer included in the organic layers 16 which is nearest to the reflective electrode 12, but may be inserted between the organic layers 16.

In the embodiments described above, the colors emitted by each subpixel are assumed to be the three primary colors of RGB. Nevertheless, each subpixel may emit other colors not limited to the three colors RGB. This invention is applicable as long as the light of two or more colors is emitted by each subpixel.

Also, the embodiments described above deal with the full-color display to emit RGB from each subpixel. Instead, what is called the area color display may be employed in which a different color is emitted for a different area. In this case, the fabrication method of the organic EL display according to the invention can be used for the subpixel replaced with an appropriate area.

Further, in the organic EL display according to the invention, all of the hole transporting layer, the hole injection layer, the electron transporting layer and the electron injection layer are not required as the function layers, but at least one layer may exist between the emissive layer and the reflective layer. This invention is applicable also to the case where three or more layers exist between the emissive layer and the reflective layer.

The organic EL display according to the invention may be of either top emission type or bottom emission type, or either passive or active type. Further, in the first and second embodiments described above, the thickness of the organic EL cell 3 and/or the optical transparent conductive film is not necessarily optimized based on the B subpixel, but the thickness and the refractive index of each material may be optimized based on the organic EL cell 3 of any color.

EXAMPLE 1

In the organic EL display according to this specific example, two pixels including a pixel designed according to the invention and a pixel designed based on the prior art are prepared, and compared with each other in chromaticity and brightness. In the second pixel, the optical transparent conductive film is not formed on the reflective electrode unlike in the prior art, but the thickness of the hole transporting layer and the hole injection layer are fixed for all the subpixels of RGB. In the first pixel, on the other hand, the optical transparent conductive film of ITO as thin as 20 nm is formed on the reflective electrode for all the subpixels of RGB. The structural difference between the first and second pixels lies only in the presence or absence of the optical transparent conductive film in each of the RGB subpixels, and the other layers have substantially the same size.

The second pixel is so designed that the straight light and the reflected light of the organic EL cell for blue emission can be emitted by being reinforced with each other, while the layers of the organic EL cell of the first pixel have the same thickness.

The material and thickness of each layer of the first and second pixels are as follows:

Substrate: glass (0.7 mmt)
Reflective electrode: Al mixture or Cr (300 nm)
Optical transparent conductive film: ITO (20 nm thick)
Hole injection layer: (20 nm)
Hole transporting layer: (10 nm)
Emissive layer: (25 nm)
Electron transporting layer: (not used)
Electron injection layer: (20 nm for B, 30 nm for G, 45 nm for R)
Transparent electrode: MgAg+ITO (30 nm)

In this specific example, the brightness of each light of RGB of the second pixel in the display is set at 100%, and the brightness of the first pixel is evaluated. As a result, the first sample formed with the optical transparent conductive film is improved in brightness by 29% and 23% for R and G, respectively, while the brightness of light B is decreased by 13%. This is considered due to the fact that as described above, the straight light and the reflected light of the organic EL cell for blue emission are optimized by being reinforced with each other in the second pixel, and therefore the brightness of the first pixel formed with the optical transparent conductive film is decreased.

Figure 2:
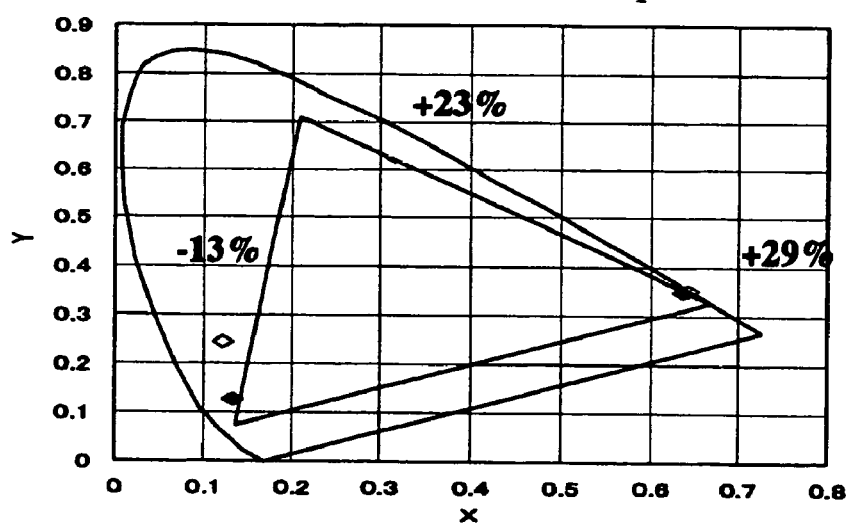
FIG. 2 is a CIE chromaticity diagram in which the CIE chromaticity of first and second pixels are plotted according to the first embodiment.

In FIG. 2, the CIE chromaticity of the first and second pixels are plotted in a CIE chromaticity diagram. The CIE chromaticity of the first pixel is plotted in white, and that of the second pixel in black. For the same reason as the brightness, the chromaticity of B is low, while the chromaticity of R and G are slightly improved.

As in the organic EL display 1 according to the first embodiment of the invention, the optical transparent conductive film 50 of a predetermined thickness is formed on the reflective electrode 12 only for the subpixels of R and G, and the hole injection layer 20 and the hole transporting layer 22 are formed in the same thickness. Then, the organic EL cell for the B subpixel is optimized, and the brightness of R and G can be improved by at least 20% while maintaining the color purity and brightness of B at the same time.

While the embodiments of the present invention have thus been described with reference to the drawings, it should be understood that the present invention be not limited to the embodiments shown in the drawings. Various changes, modifications, and improvements can be made to the embodiments on the basis of knowledge of those skilled in the art without departing from the scope of the present invention.

What is claimed is:

1. An organic EL display comprising a plurality of organic EL cells each including:
   a plurality of organic layers including an emissive layer which have a first main surface and a second main surface;
   a reflective electrode deposited on the first main surface of the organic layer; and
   a transparent electrode deposited on the second main surface of the organic layer;
   wherein the organic EL cells are classified into at least two types by the color emitted from the emissive layer of each organic EL cell; and
   wherein at least one type of the organic EL cell has an optical transparent conductive film interposed between the reflective electrode and the organic layer.

2. An organic EL display comprising a plurality of organic EL cells each including:
   a plurality of organic layers including an emissive layer which have a first main surface and a second main surface;
   a reflective electrode deposited on the first main surface of the organic layer; and
   a transparent electrode deposited on the second main surface of the organic layer;
   wherein the organic EL cells are classified into at least three types of blue light emission, green light emission and red light emission by the color emitted from the emissive layer of each organic EL cell; and
   wherein at least the organic EL cells for selected one of green light emission and red light emission have an optical transparent conductive film interposed between the reflective electrode and the organic layer.

3. The organic EL display according to claim 2, wherein each of the three types of the organic EL cells include an optical transparent conductive film interposed between the reflective electrode and the organic layer, and wherein the optical transparent conductive film of the organic EL cell for green light emission and/or red light emission is thicker than the optical transparent conductive film of the organic EL cell for blue light emission.

4. The organic EL display according to claim 2,
   wherein the organic EL cell for green light emission and/or red light emission has a longer distance between the emissive layer and the reflective electrode layer than the organic EL cell for blue light emission.

5. The organic EL display according to claim 2,
   wherein all of the optical transparent conductive films of the organic EL cells for green light emission and/or red light emission have a substantially same thickness.

6. The organic EL display according to claim 2,
   wherein the organic layers have at least selected one of a hole transporting layer and/or a hole injection layer or an electron transporting layer and/or an electron injection layer on the reflective electrode side of the emissive layer, and
   wherein the thickness and the material of the hole transporting layer and/or the hole injection layer or the electron transporting layer and/or the electron injection layer are substantially same for all the organic EL cells for blue light emission, green light emission and red light emission.

7. The organic EL display according to claim 1,
   wherein the distance from the first main surface of the organic layers to the emissive layer is substantially same for all of the organic EL cells.

8. The organic EL display according to claim 2,
   wherein the distance from the first main surface of the organic layers to the emissive layer is substantially same for all of the organic EL cells.

9. A method of fabricating an organic EL display comprising a plurality of organic EL cells each including an emissive layer and at least one function layer, the organic EL cells being classified into at least three types of blue light emission, green light emission and red light emission by the color emitted from the emissive layer, the method comprising the steps of:
- preparing a substrate;
- forming a plurality of reflective electrodes on the substrate;
- forming an optical transparent conductive film on each of the reflective electrodes corresponding to the organic EL cell for red light emission and/or green light emission;
- forming at least one function layer over the whole surface of the substrate; and
- forming the emissive layers for blue light emission, green light emission and red light emission on the one function layer corresponding to the organic EL cell for blue light emission, green light emission, and red light emission respectively.

* * * * *